Feb. 21, 1967 B. PARZEN 3,305,730

FREQUENCY DIVIDER CIRCUIT

Filed April 18, 1963

INVENTOR.
BENJAMIN PARZEN

BY Darby & Darby

ATTORNEYS

United States Patent Office 3,305,730

Patented Feb. 21, 1967

3,305,730

FREQUENCY DIVIDER CIRCUIT

Benjamin Parzen, 241 E. 76th St., New York, N.Y. 10021

Filed Apr. 18, 1963, Ser. No. 273,902
3 Claims. (Cl. 307—88.5)

This invention relates to frequency divider circuits and more particularly to a simplified frequency divider of the non-free running type in which an input signal must be applied to the divider to produce an output signal of the desired frequency.

As is known, frequency divider circuits are used to reduce the frequency of a signal by an integral multiple of the original frequency of the signal. For example, a typical frequency divider circuit would take a signal of frequency $2f$ and divide it down by the integer two to a requency $f$. There are two general types of frequency dividers, those of the free runnnig type which produce an output signal whether an input signal is present or not, and those of the non-free running which produce an output signal only when an input signal is applied.

Free running frequency dividers usually take the form of some variety of oscillator circuit synchronized by a signal of a higher frequency which is to be divided down to a lower frequency. Typical examples of such circuits are free running multivibrators and oscillators of the tuned circuit type which are synchronized by the higher frequency signal. Because of their construction, all free running circuits produce an output signal in the absence of an input signal. Normally, this free running output signal will not be of the desired lower frequency and in some cases the presence of this output signal is undesirable since it might give rise to erroneous indications or system operation by virtue of the fact that the output signal is not of the desired lower frequency.

In frequency dividers of the non-free running type, a higher frequency input signal must be applied to the circuit before it can operate to produce the desired lower frequency output signal. Such a circuit arrangement is used in many cases where fail-safe provisions are necessary so that no erroneous output signal will be produced for further system use in the absence of the input signal.

One type of non-free running divider makes use of a mixer circuit to which the higher frequency signal to be divided down is applied. A multiplier is connected to the output of the mixer for multiplying the desired lower frequency signal at the output of the mixer by a factor of $(n \pm 1)$ where $n$ is an integer. The output of the multiplier is applied back to the input of the mixer where it mixes with the higher frequency input signal to produce an additional quantity of the desired lower frequency signal. In this manner, the desired lower frequency signal is produced as long as the higher frequency signal to be divided down in frequency is applied to the input of the mixer.

The present invention relates to a simplified frequency divider circuit of the non-free running type in which the functions of the mixer and the multiplier are combined in a single vacuum tube or transistor device. In accordance with the invention a relatively simple and highly reliable circuit is provided which is capable of producing the desired frequency division. The circuit is capable of accepting a sine wave signal input and producing a sine wave signal output. It can also operate at high signal frequencies and is fail-safe since no output signal is produced in the absence of an input signal. In a preferred embodiment of the invention, the circuit is used as a binary frequency divider to divide an input signal of frequency $2f$ down to a signal of frequency $f$. Of course, the principles of the invention can be extended to obtain division by any integral number, within the power limits of the divider circuit.

It is therefore an object of this invention to provide a simplified frequency divider circuit.

A further object of the invention is to provide a circuit for frequency division in which only a single electron discharge device is used.

Another object of the invention is to provide a simplified frequency divider which uses only a single transistor to perform all of the necessary functions.

Other objects and advantages of the present invention will become more apparent upon reference to the following specification and annexed drawings in which.

Figure 1:
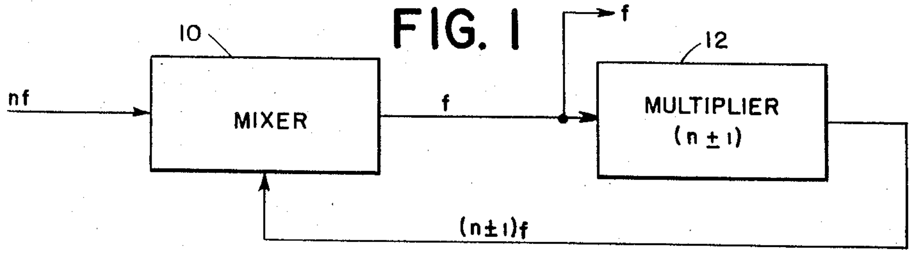
FIGURE 1 is a block diagram illustrating certain principles of the invention.

FIGURE 1 illustrates the operating principles of the mixer-multiplier type of non-free running frequency divider. Here, the higher frequency input signal of frequency $nf$ is applied to the input of a mixer circuit 10. This input signal is to be divided down to a signal of a lower frequency $f$. When the circuit is initially turned on, by virtue of the noise present in the mixer circuit 10 and other inherent circuit action, a quantity of the desired lower frequency $f$ is present at the output of the mixer. This signal of frequency $f$ is applied to the input of a multiplier circuit 12 where it is multiplied by a factor of $(n \pm 1)$. The multiplication action also produces some amplification. Thus, the resultant output signal of multiplier 10 is of frequency $(n \pm 1)f$.

The multiplier output signal $(n \pm 1)f$ is applied back to the input of the mixer 10 where it mixes with the input signal of frequency $nf$. Because the mixer produces the sum and difference of all applied input signals, one of the signals at the mixer output is of the desired frequency $f$. The $f$ signal is now of a larger value than it was initially because of the increased amount of $f$ signal available for mixing by virtue of the amplification of the initial $f$ signal. The cycle repeats itself with the $f$ signal being applied to the multiplier 12 to progressively increase the amount of signal being fed back to the input of the mixer. Thus, the amplitude of the $f$ signal at the mixer output increases until the desired amplitude is reached and the mixing action continues as long as the input signal $nf$ is applied.

Considering now the special case where an input signal of frequency $2f(n=2)$ is to be divided by a factor of two to a signal of frequency $f$, the $2f$ signal is applied to the mixer input. At the first instant of operation, a signal of frequency $f$ is present at the output of the mixer and is applied to the multiplier 12. The multiplier output is now of frequency $3f$ or $f$. Either of the $3f$ or $f$ signals can be applied back to the mixer input to mix with the $2f$ signal since the mixer will produce an output of both $3f-2f=f$ or $2f-f=f$. Here again, the circuit action repeats to build up the amplitude of the desired signal of frequency $f$.

If a frequency selective circuit is used at the multiplier output to select one of these signals, say the signal of frequency $f$, then the multiplier can be simplified and made an amplifier to amplify only the desired signal of frequency $f$ at the output of the mixer 10 and feed it back to the mixer input.

Figure 2:
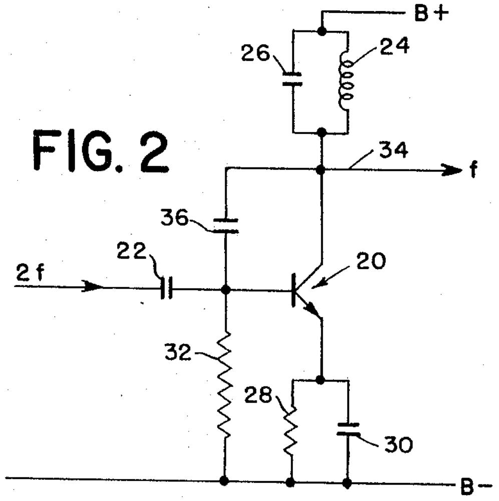
FIGURE 2 is a schematic diagram of preferred embodiment of a frequency divider made according to the present invention.

FIGURE 2 shows a relatively simple frequency divider circuit using the principles of operation described in FIGURE 1. This circuit combines the operations of the mixer 10 and the multiplier or amplifier in a single transistor 20. The transistor 20 is illustratively shown as being of the NPN type although a PNP transistor can be used if the power supply polarities are reversed. Considering the circuit of FIGURE 2 to be operating as a binary frequency divider, the input signal of frequency 2*f* is applied to the base electrode of the transistor through a capacitor 22. This signal is to be divided in half to a frequency *f*. A parallel resonant tuned circuit, formed by the coil 24 and the capacitor 26, is connected to the collector electrode of the transistor. B+ voltage from a suitable source such as a battery (not shown) is applied to the collector electrode through the coil 24. The resonant circuit 24, 26 is tuned to the desired frequency of the circuit output signal, which in the case is of a frequency *f*, by adjusting either the capacitor or the coil.

A parallel connected resistor capacitor circuit 28 and 30 is connected from the emitter of the transistor to a point of B− potential such as ground. The capacitor 30 bypasses the resistor 28 at the operating signal frequencies in the well known manner. Base to emitter bias is provided by connecting a resistor 32 from the base electrode to the point of B− potential. The output signal of desired frequency *f* is taken from the collector electrode on lead 34 and a feedback path is provided for the signal of frequency *f* from the collector to the base electrodes by the capacitor 36.

Considering now the operation of the circuit, with no signal applied to capacitor 22, transistor 20 is cut-off since there is no forward bias between the base and emitter electrodes. It should be understood that the parameters of the circuit are selected so that the circuit will not oscillate or produce any other output signal in the absence of the input signal. When an input signal of frequency 2*f* is initially applied to capacitor 22 and to the base electrode of the transistor, the non-linearity of the components connected to the base electrode and to other parts of the circuit, the non-linearity of the transistor 20, the noise in the circuit will cause a small amount of signal of frequency *f* to be present at the collector.

While the initial amplitude of the *f* signal is relatively small, its amplitude is rapidly increased in the following manner. The parallel resonant circuit 24, 26, which is tuned to the desired frequency *f*, produces a high impedance load for a signal of this frequency. Therefore, the transistor 20 acts as a selective amplifier for the signal of frequency *f* and amplifies it to a considerable extent to the exclusion of signals of all other frequencies, including the input signal of frequency 2*f*. The amplified signal of frequency *f* is coupled back to the base electrode of the transistor through the capacitor 36 where it is mixed with the input signal of frequency 2*f*. The mixer action of the transistor produces a difference frequency signal of frequency *f* in the well known manner and this signal is further amplified by the selective amplifier action aided by the tuned circuit 24, 26. Thus, the transistor 20 operates as both a mixer for the two applied signals and as an amplifier to further increase the amplitude of the desired signal of frequency *f*.

While the buildup of the *f* frequency signal at the base electrode is regenerative in nature, the circuit does not oscillate. This is so because the *f* frequency feedback signal is not wholly in phase with the input signal 2*f*. Therefore, the *f* signal ceases upon removal of the 2*f* input signal. The final amplitude of the *f* signal is limited principally by the biasing elements of the circuit. The forward bias across resistor 32 is a combination of the 2*f* and *f* signals, with the 2*f* signal largely predominating.

Therefore it can be seen that the single transistor in the circuit of FIGURE 2 operates in a simple and effective manner as a binary frequency divider. The circuit is simple and economical in construction and it is very stable and maintains a jitter free relationship between the signals of frequency *f* and 2*f*.

Figure 3:
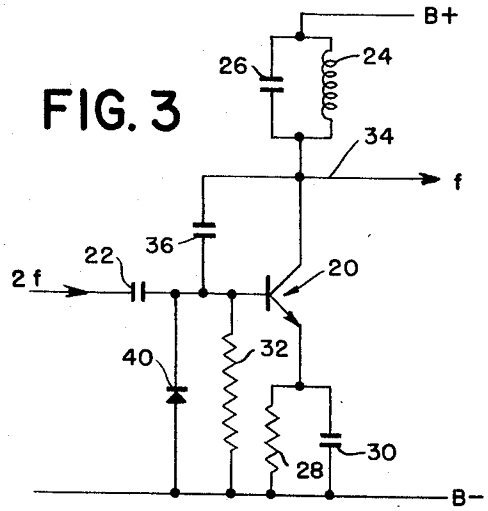
FIGURES 3 and 4 are schematic diagrams of other embodiments of the invention.

FIGURE 3 shows a circuit which is essentially similar to that of FIGURE 2 except that a diode 40, which is preferably of the junction type, has been placed in parallel across the emitter resistor 32. All other parts of the circuit are the same as FIGURE 2 and they have been indicated with the same reference numerals. The diode 40, which is a non-linear device, serves to enhance the mixing action of the two signals *f* and 2*f*. Also, the diode 40 provides surge protection against excess base-emitter reverse voltages. This type of surge protection is, in itself, well known and is described at page 100 of the Department of the Army Technical Manual TM 11–690, dated March 1959. The circuit of FIGURE 3 operates in the manner previously described with respect to FIGURE 2 and additional mixing action and surge protection is provided by the diode 40.

Figure 4:
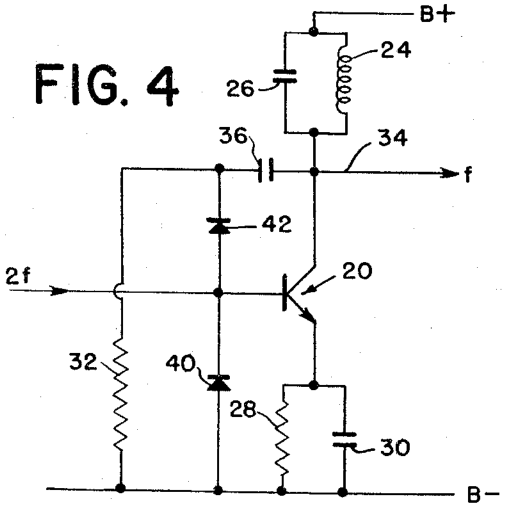

FIGURE 4 shows another embodiment of the invention which is like that of FIGURE 3 except that a diode 42 has been added in the series return path of the capacitor 36 between the collector and emitter electrodes. Also, the resistor 32 is now connected across both diodes rather than across diode 40 only. Here again, the diode 40 is used to enhance the mixing action and to provide surge protection. The additional diode 42 effectively isolates the base to emitter bias from the effects of the *f* output signal. As can be seen, both diodes 40 and 42 are non-conducting when a positive signal is present at capacitor 36 while both diodes are conducting in response to a negative signal. When the latter occurs, the diode 40 forms a short circuit from base to emitter and prevents the formation of a base to emitter bias by the *f* signal. Positive going 2*f* signal establishes the bias around the path from the base of the transistor, through diode 42 and back through resistor 32 to ground. This arrangement makes the base to emitter bias more stable thereby improving the reliability of the circuit.

Therefore it can be seen that a frequency divider circuit of the non-free running type has been provided which is both simple and economical in construction and is capable of maintaining a high degree of stability. The circuit can accept sine wave input signals of a relatively high frequency and produce a sine wave output signal of a reduced frequency with relatively little distortion. Further, the circuit is fail-safe since no output is produced in the absence of an input signal. While the circuit has been described with respect to use as a binary divider for producing a frequency of *f* in response to a higher frequency of 2*f*, it should be recognized that division by other integers is also possible, for example dividing by a factor of 3, 4, 5, etc. All that is necessary is to tune the resonant circuit 24, 26 to the frequency of $(n\pm1)$ times the desired lower frequency output signal *f* and feed the $(n\pm1)f$ signal back to the base input of the transistor.

Although a particular structure has been described, it should be understood that the invention should not be limited to the particular embodiments of the invention shown by way of illustration, but rather to the scope of the invention covered by the appended claims.

What is claimed is:

1. A frequency divider circuit for dividing the frequency of a first signal down to a second signal of a desired lower frequency comprising a semiconductor device having means connected thereto for operating said device as a selective amplifier at the frequency of the second signal, said semiconductor device having base, emitter and collector electrodes, said first signal being applied to said base electrode, a frequency selective circuit connected to said collector electrode, said semiconductor device producing a quantity of said second signal at the desired lower frequency and said frequency selective circuit being tuned to present a high impedance to the semiconductor at the desired lower frequency whereby the said second signal is selectively amplified by the semiconductor device, means connected between said collector and base electrodes for feeding back a portion of the amplified second signal at the collector electrode to the base electrode to mix with the first signal and to further increase the amount of the second signal amplified by the semiconductor device, and a first diode connected between said base and emitter electrodes for increasing the mixing action of the first and second signals.

2. A frequency divider circuit as set forth in claim 1 wherein said first diode is connected in the circuit to provide surge protection against excessive reverse bias voltages in the base to emitter circuit.

3. A frequency divider circuit for dividing the frequency of a first signal down to a second signal of a desired lower frequency comprising a semiconductor device having means connected thereto for operating said device as a selective amplifier at the desired lower frequency of said second signal, said semiconductor device having base, emitter and collector electrodes, said first signal being applied to said base electrode, a frequency selective circuit connected to said collector electrode, said semiconductor device producing a quantity of the second signal at the desired lower frequency and said frequency selective circuit being tuned to present a high impedance to the semiconductor at the desired lower frequency whereby the said second signal is selectively amplified by the semiconductor device, means connected between said collector and base electrodes for feeding back a portion of the amplified second signal at the collector electrode to the base electrode to further increase the amount of the second signal amplified by the semiconductor device, a first diode connected between said base and emitter electrodes for increasing the mixing action of the first and second signals and a second diode connected in series between said feedback means and said base electrode for isolating the bias voltage of said base electrode from said second signal.

References Cited by the Examiner

UNITED STATES PATENTS

| | | | |
|---|---|---|---|
| 2,926,244 | 2/1960 | Stryker | 328—25 |
| 3,140,447 | 7/1964 | Olbrych et al. | 328—15 |

ARTHUR GAUSS, *Primary Examiner*.

S. D. MILLER, *Assistant Examiner*.